United States Patent
Zawada et al.

(10) Patent No.: US 10,079,336 B2
(45) Date of Patent: Sep. 18, 2018

(54) FLEXIBLE PIEZOELECTRIC MATERIAL, PRODUCTION AND USE THEREOF

(71) Applicant: Meggitt A/S, Kvistgård (DK)

(72) Inventors: Tomasz Zawada, Frederiskberg (DK); Karsten Hansen, Vallensbæk (DK); Konstantin Astafiev, København (DK); Erling Ringgaard, Bagsværd (DK)

(73) Assignee: MEGGITT A/S, Kvistgard (DK)

( * ) Notice: Subject to any disclaimer, the term of this patent is extended or adjusted under 35 U.S.C. 154(b) by 0 days.

(21) Appl. No.: 14/153,556

(22) Filed: Jan. 13, 2014

(65) Prior Publication Data
US 2015/0200351 A1    Jul. 16, 2015

(51) Int. Cl.
*H01L 41/18* (2006.01)
*H01L 41/187* (2006.01)
(Continued)

(52) U.S. Cl.
CPC .......... *H01L 41/183* (2013.01); *H01L 41/314* (2013.01); *H01L 41/37* (2013.01)

(58) Field of Classification Search
CPC ............. H01L 41/1876; H01L 41/1875; H01L 41/1873; H01L 41/187; H01L 41/183;
(Continued)

(56) References Cited

U.S. PATENT DOCUMENTS 4,265,841 A * 5/1981 Fujimori et al. .............. 264/430
4,560,737 A * 12/1985 Yamamoto .............. C08L 27/16
264/288.4

(Continued)

FOREIGN PATENT DOCUMENTS

EP    1 791 195 A1    5/2007
EP    2 608 287 A1    6/2013

OTHER PUBLICATIONS

Dietze et al., "Structural and functional properties of screen-printed PZT-PVDF-TrFE composites", 2008, Sensors and Actuators A, 143, pp. 329-334.*

(Continued)

*Primary Examiner* — Matthew E. Hoban
*Assistant Examiner* — Lynne Edmondson
(74) *Attorney, Agent, or Firm* — Hackler Daghighian Martino & Novak

(57) ABSTRACT

A composite piezoelectric material, manufacturing of the composite material and use of this composite material in piezoelectric components are disclosed. More particularly, a piezoelectric thick film materials or piezoelectric paint being a composite piezoelectric material including piezoelectric particles randomly dispersed within a polymer matrix are disclosed. A paste of composite piezoelectric material including a matrix of polymer having a relative permittivity $\geq 3$, normally $\geq 6$, sintered piezoelectric particles having a relative permittivity in the range of 100-5000, normally in the range of 400-1000 and an average particle size between 1 and 50 μm, although the particles should be smaller than $\frac{1}{10}$ of the final thickness of the final layer of piezoelectric material, and additives such as dispersing agents or thinner are disclosed where the final paste has a 0-3 connectivity pattern, a content of sintered piezoelectric particles between 15 and 75 vol %, normally between 40 and 60 vol %.

18 Claims, 3 Drawing Sheets

(51) Int. Cl.
*H01L 41/43* (2013.01)
*H01L 41/37* (2013.01)
*H01L 41/314* (2013.01)

(58) Field of Classification Search
CPC ............. H01L 41/1871; H01L 41/1878; H01L 41/314; H01L 41/43; H01L 41/37; H01L 41/0805; B41J 2/161; B41J 2/1642; B41J 2/1646; C04B 2235/768; Y10T 29/42
USPC ....... 252/62.9 PZ, 62.9 R; 310/358; 427/100
See application file for complete search history.

(56) References Cited

U.S. PATENT DOCUMENTS

| | | | | |
|---|---|---|---|---|
| 4,917,810 | A * | 4/1990 | Tsunooka | H01L 41/183 252/62.9 R |
| 4,977,547 | A * | 12/1990 | Giniewicz | H01L 41/1878 252/62.9 R |
| 5,043,622 | A | 8/1991 | Sagong et al. | |
| 5,374,449 | A * | 12/1994 | Buhlmann et al. | 427/100 |
| 5,702,629 | A * | 12/1997 | Cui et al. | 252/62.9 R |
| 5,951,908 | A * | 9/1999 | Cui | H01L 41/183 252/62.9 R |
| 2006/0223691 | A1* | 10/2006 | Shih | C04B 35/495 501/134 |
| 2007/0096591 | A1* | 5/2007 | Fujii | B41J 2/161 310/311 |
| 2011/0014362 | A1* | 1/2011 | Koizumi | C04B 35/493 427/100 |
| 2011/0096388 | A1* | 4/2011 | Agrawal | G02F 1/1506 359/268 |

OTHER PUBLICATIONS

Ferroperm Piezoceramics A/S Pz21 Datasheet, retrieved online from http://www.ferroperm-piezo.com/files/files/Pz21%20Datasheet.pdf, printed Jul. 24, 2015, 2 pages.*
Piezoelectric Films Technical Information, Piezotech S.A.S, rectrieved online from http://www.piezotech.fr/image/documents/22-31-32-33-piezotech-piezoelectric-films-leaflet.pdf, printed Jul. 24, 2015, pp. 1-19.*
MEMSnet, Material: PVDF-TrFE, retreived online from https://www.memsnet.org/material/pvdftrfecopolymerofvinylidenefluoridetrifluoroethylenefilm/, printed Jul. 24, 2015, 1 page.*
Arlt et al,; "Piezoelectric PZT/PVDF-copolymer 0-3 Composites: Aspects on Film Preparation and Electrical Poling", Aug. 2010, Fraunhofer institute for Applied PolymerResearch (IAP); IEEE Transactions on Dielectrics and Electrical Insulation, vol. 17, No. 4, pp. 1178-1183.*
Clipper Controls, "Dielectric Constant Values", retrieved online from http://www.clippercontrols.com/pages/Dielectric-Constant-Values.html, printed Apr. 14, 2016, 7 pages.*
Yao et al., "Design and Fabrication of a High Performance Multilayer Piezoelectric Actuator with Bending Deformation", Jul. 1999, IEEE Transactions on Ultrasonics, Ferroelectrics and Frequency Control, vol. 46, No. 4, pp. 1020-1027.*
Songhan Plastic Technology Co., Ltd., Dupont Surlyn 8120 datasheet, printed from website http://www.lookpolymers.com/polymer_DuPont-Surlyn-8120-Ionomer-Resin-Sodium-nbspdiscontinued-.php, on Nov. 8, 2016, 2 pages.*
Wikipedia, "Lead zirconate titanate" (https://en.wikipedia.org/wiki/Lead_zirconate_titanate), printed Jul. 26, 2017, 3 pages.*
Vega,"List of Dielectric Constants", (https://www.vega.com/-/media/PDF-files/List_of_dielectric_constants_EN.ashx), printed Jul. 28, 2017, 8 pages.*
K. Arlt et al.; "Piezoelectric PZT/PVDF—copolymer 0-3 Composites: Aspects on Film Preparation and Electrical Poling"; Fraunhofer Institute for Applied Polymer Research (IAP); IEEE Transactions on Dielectrics and Electrical Insulation vol. 17; No. 4; Aug. 2010.
V. Giurgiutiu et al.; "In-situ Fabricated Smart Material Active sensors for structural Health Monitoring"; Smart Materials III, ed. by Alan R. Wilson; Proceedings of SPIE vol. 5648; pp. 68-78; Feb. 16, 2004.
R. Lahtinen et al.; "A piezopaint-based sensor for monitoring structure dynamics"; Smart Materials and Structures, vol. 16; pp. 2571-2576; Oct. 31, 2007.
X. Li et al.; "Analytical study of piezoelectric paint sensor for acoustic emission-based fracture monitoring"; Fatigue & Fracture of Engineering Materials & Structures, vol. 31, Issue 8; pp. 684-694, Aug. 2008.
I. Payo et al.; "Dynamic characterization of piezoelectric paint sensors under biaxial strain"; Sensors and Actuators A: Physical, vol. 163; pp. 150-158; Aug. 11, 2010.
Akdogan, EK et al.; "Piezoelectric composites for sensor and actuator applications"; IEEE Transactions on Ultrasonics, Ferroelectronics and Frequency Control; vol. 52, No. 5, May 1, 2005; pp. 746-775; XP011367393.
Babu, I et al.; "Processing and characterization of piezoelectric 0-3 PCT/LCT/PA composites"; Journal of Physics D. Applied Physics; vol. 43, No. 42; Oct. 7, 2010; XP020199137.
Estevam, G et al.; "Photopyroelectric response of PTCa/PEEK composite"; Review of Scientific Instruments, vol. 82, No. 2; Feb. 17, 2011.

* cited by examiner

A                              B

FLEXIBLE PIEZOELECTRIC MATERIAL, PRODUCTION AND USE THEREOF

FIELD OF THE INVENTION

This invention generally relates to a composite piezoelectric material, manufacturing of the composite material and use of this composite material in piezoelectric components. More particularly, the invention relates to piezoelectric thick film materials or piezoelectric paint being a composite piezoelectric material comprising piezoelectric particles randomly dispersed within a polymer matrix.

BACKGROUND OF THE INVENTION

The value of the composite piezoelectric material is characterized by its ability to capture signals emitted by the substrate material to which it is attached. The signals may e.g. originate from vibrations, crack formation, torsion, movement or transformations of the substrate material.

The document U.S. Pat. No. 5,702,629 discloses methods and compositions for preparing piezoelectric ceramic-polymer composites in the form of compacted disks.

More recently composite piezoelectric materials have been described in the form of pastes or paints, i.e. in the form of a mixture of a soft and malleable consistency. These materials are also referred to as piezoelectric thick film materials or piezoelectric paint. In particular the usability of such materials for structural health monitoring applications has attracted considerable attention, For example, X. Li and Y. Zhang: "Analytical study of piezoelectric paint sensor for acoustic emission-based fracture monitoring", in Fatigue & Fracture of Engineering Materials & Structures, Volume 31, Issue 8, pages 684-694, August 2008, have studied the properties of a piezoelectric paint for the acoustic emission technique for non-destructive evaluation such as fracture monitoring in metal, concrete and composite structures. Composites according to this reference comprises piezoelectric paints constituted of tiny piezoelectric particles mixed within polymer matrix and belonging to the '0-3' piezoelectric composite meaning that the piezoelectrically active ceramic particles are randomly dispersed in a three-dimensionally connected polymer matrix. The advantages of this material is its ease of fabrication into complex shapes including large flexible thin sheets, extruded bars and fibres and moulded shapes and the material may conform to any curved surface.

V. Giurgiutiu and Bin Lin, "In-situ Fabricated Smart Material Active sensors for structural Health Monitoring", in Smart Materials III, ed. By Alan R. Wilson, Proceedings of SPIE Vol. 5648, have identified in-situ composite piezoelectric wafer active sensors as good candidates for reliable low-cost options for Structural Health Monitoring (SHM) smart sensor fabrication due to the ease with which their mechanical properties may be tailored, low cost ease of implementation, conformability to curved surface and compatibility with polymeric materials. The piezoelectric composite is made of a PZT powder added to an epoxy matrix phase, the paste is then spread into a mask and allowed to cure at an elevated temperature around 50° until hard. At last excess is removed and the composite is sanded down to final thickness.

I. Payo and J. M. Hale, "Dynamic characterization of piezoelectric paint sensors under biaxial strain", in Sensors and Actuators A 163, 2010, page 150-158, discloses a piezoelectric paint film designed to be used as a strain sensor. The composite is a suspension If milled PZT (lead zirconate titanate) ceramic powder in a polymer binder in the form of a water-based acrylic. The piezoelectric material film is applied to the substrate with a conventional spray gun directly to the top surface of the substrate. It is pointed out in the paper that the described piezoelectric paint sensors present some advantages with respect to other film sensors such as e.g. PZT ceramics and polyvinylidene fluoride (PVDF).

R. Lahtinen et al., "A piezopaint-based sensor for monitoring structure dynamics", in Smart Materials and Structures, 16, 2007, page 2571-2576, disclose a combination of a piezoelectric powder with a paint resin such as an epoxy resin which resulting paint can easily be applied to almost any surface. The paint is used as a vibration sensor e.g. on a footbridge and the paint is applied with a laboratory application such as a doctor blade with a fixed gap or alternatively by spraying. In the text page 2571, col. 1, lines 10-14, it is mentioned that vibration and strain monitoring commonly is solved by using piezoelectric polymers such as Polyvinylidene fluoride (PVDF) or strain gauges but the thermal stability of PVDF is limited to 80° and the strain gauges require elaborate temperature compensation.

K. Arlt and M. Wegener, "Piezoelectric PZT/PVDF—copolymer 0-3 Composites: Aspects on Film Preparation and Electrical Poling", Fraunhofer Institute for Applied Polymer Research (IAP), IEEE Transactions on Dielectrics and Electrical Insulation Vol. 17, No. 4, August 2010, discloses composite films of PZT (lead zirconate titanate) and different i.e. non-polar and polar PVDF (Polyvinylidene fluoride) copolymers prepared as 30-150 μm thick freestanding flexible films. The article considers the influence of the poling time and the poling-temperature regimes on piezoelectric properties achieved in the composite. The composite films are prepared by solvent casting the mixtures onto glass plates The document U.S. Pat. No. 5,951,908 disclose compositions and processes for fabrication of piezoelectric composites comprising piezoelectric particles embedded in a polymer matrix having improved figures of merit for both sensor and non-sensor applications. The improvements result from discoveries of the effects of polymer bulk compliance, polymer anisotropy, polymer melt index and polymer/ceramic wettability on performance. In order to avoid substantial void volume in the composite, the polymer matrix should wet the ceramic particles properly and diffuse into the gaps between the ceramic particles to form a cavity-free composite. Use of curable resins such as epoxy and polyurethane resins can be used to make 0-3 composites according to this document.

The document U.S. Pat. No. 4,917,810 discloses a piezoelectric composite material prepared by compounding a ferroelectric ceramic powder comprising microcrystals having virtually single domains and a polymer. The ferroelectric ceramic powder can be mixed with a wide variety of polymers, molded in an arbitrary shape e.g. a sheet, subjected to a hardening treatment such as cross-linking or vulcanization and then polarized to prepare the piezoelectric composite material.

Definitions

PZT—lead (P) zirconate (Z) titanate (T) (piezoelectric ceramic)

KNN—Alkali Niobate based material e.g. $K_{0.5}Na_{0.5}NbO_3$

AE—Acoustic Emission $d_{33}$—piezoelectric charge constant (p C/N=pica ($10^{-12}$) Coulomb/Newton)

It should be emphasized that the term "comprises/comprising" when used in this specification is taken to specify the presence of stated features, integers, steps or components but does not preclude the presence or addition of one or more other features, integers, steps, components or groups thereof.

"Satisfying wetting properties" indicates that a contact angle of less than 90° is obtained between fluid and solid substrate.

"Substrate" is the technical name used to address any parts or materials to which a film or layer of composite piezoelectric material is attached and is intended to finally function, it is critical to match substrates and piezoelectric paste as to their chemical compatibility such as e.g. wettability. Substrates need to be clean and free from surface contamination to allow proper paste adhesion.

SUMMARY

According to a first aspect the present invention relates to a paste of composite piezoelectric material comprising or consisting of:
a matrix of polymer having a relative permittivity≥3, normally ≥6,
sintered piezoelectric particles having a relative permittivity in the range of 100-5000, normally in the range of 400-1000 and an average particle size between 1 and 50 µm, although the particles should be smaller than 1/10 of the final thickness of the final layer of piezoelectric material, and
additives such as dispersing agents or thinner, further the final paste i.e., the paste which is to be placed on a substrate, has
a 0-3 connectivity pattern,
a content of sintered piezoelectric particles between 15 and 75 vol %, normally between 40 and 60 vol %, For most composite materials the optimum will be below 55 vol %.

According to an embodiment of the invention, the sintered piezoelectric particles are manufactured from a ceramic piezoelectric active powder which is first pressed and then sintered at a temperature above 1100° C. for a period of at least 0.5 hours. Normally, the powder is pressed into a solid unit at a pressure above 500 bars, and normally the sintering temperature will be 1100-1300° C. and the sintering time will be 1-2 hours. The ceramic piezoelectric active powder can be a commercially available powder e.g. of the type Pz24, Pz26, Pz59 or Lead-Free.

According to this embodiment, the sintered piezoelectric material might be subjected to crushing and milling to obtain a desired particle size of $d_{0.5}$=1-50 µm, normally 7-15 µm.

According to an embodiment of the invention, the cured polymer matrix is flexible and having a Young's Modulus E≤10 CPa, normally E≤4 GPa.

According to an embodiment of the invention, the viscosity of the paste is ≤15 Pa·s at a shear rate equal to 33.3 (1/sec) and satisfying wetting properties between the paste and substrate are obtained.

According to an embodiment of the invention, the binding matrix comprises or consists of a fluoride based polymer such as Polyvinylidene fluoride (PVDF) or any other polymer material with suitable properties.

According to an embodiment of the invention, the sintered piezoelectric particles are made of a PZT material. Alternatively, the piezoelectric particles are made of a KNN family material.

According to an embodiment of the invention, the thickness of the final layer of piezoelectric material is ≥10 µm.

According to a second aspect of the present invention, the invention also relates to a method of preparing a composite piezoelectric material which method comprises or consists of the following step:

1) Preparing sintered piezoelectric particles having a relative permittivity in the range of 100-5000, normally in the range of 400-1000 and a average particle size between 1 and 50 µm, although the particles should be smaller than 1/10 of the final thickness of the final layer of piezoelectric material. Step 1) normally comprises sintering, crushing and milling of a commercially available piezo ceramic material.

2) Mixing between 15 and 75 vol %, normally between 40 and 60 vol %, normally between 40 and 50 vol % of sintered piezoelectric particles with 60-40 wt % of a polymer matrix having a relative permittivity≥3, normally ≥6, and suitable additives enhancing performance of the final paste.

3) Agitating the obtained mixture until a homogenous paste having a desired viscosity and satisfying wetting properties between paste and substrate is obtained.

According to an embodiment of the second aspect of the invention, the agitation is performed in a roller mill such as a triple roller mill.

According to an embodiment of the second aspect of the invention, the cured polymer matrix has a Young's Modulus E≤10 GPa, normally E≤4 GPa.

According to a third aspect of the present invention, the invention also relates to a method for manufacturing of a piezoelectric component, the method comprising or consisting of:
depositing a layer of a paste of piezoelectric material according to the first aspect of the invention on a substrate, the layer being thicker than 10 µm, normally between 10-30 µm, the final layer on the substrate might be formed by depositing more than one layer of paste and each layer or combination of layers are created in the final functional thickness and shape by deposition,
curing the deposited layer of composite piezoelectric material.

According to an embodiment of the third aspect of the invention, the curing comprises heating the deposited layer on the substrate at a temperature below 300° C., typically at a temperature in the range of 90-150° C.

According to an embodiment of the third aspect of the invention, the layer(s) of fluid composite piezoelectric material is deposited by screen-printing or pad-printing.

According to an embodiment of the third aspect of the invention, the substrate is a woven or non-woven textile, paper, polymer, curved or non-curved surface e.g. made of metal, ceramic or plastic or composite material e.g. comprising two or more of the mentioned materials.

In another aspect, the invention also relates to a piezoelectric component comprising a substrate and a layer of a cured composite piezoelectric material provided according to the first aspect of the invention deposited on a substrate and connected to electrodes. According to this embodiment the component can e.g. be a sensor, a transducer for structural health monitoring, an energy harvesting device or an actuator.

POLYMER MATRIX

Figure 1:
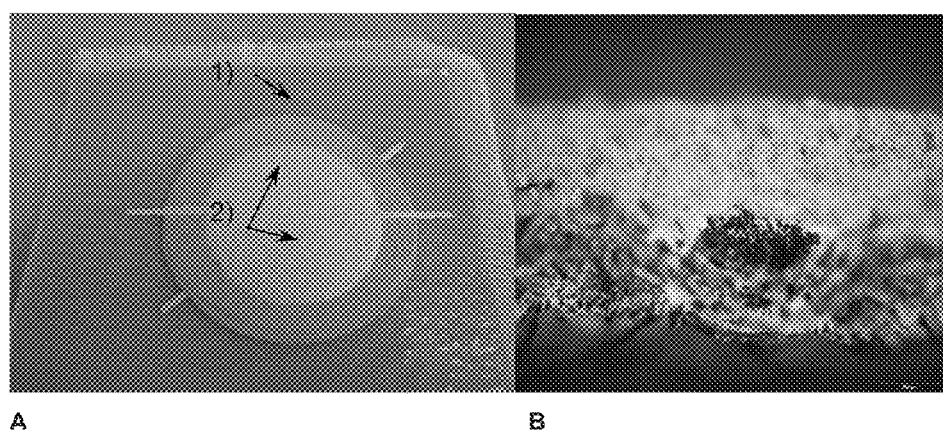
FIG. 1 shows an example of fabricated piezoelectric structure on textile (a)—top view, b)—cross-sectional view.

The composite piezoelectric material comprises a polymer, normally a non-reactive thermoplastic polymer which at working condition e.g. 20° C. in a cured state is elastic and flexible. The polymer might be a thermoplastic fluoro polymer such as a polyvinylidene fluoride (PVDF) based polymer. That the polymer is based on PVDF means that it can be a PVDF-copolymer or comprise a mixture of polymers where PVDF constitutes more than 50 wt %. The polymer can contain one or more additives e.g. improving viscosity and wetting ability. The wettability of the paste can e.g. be increased by adding additives such as surfactants to the polymer matrix.

The polymer matrix has to have a viscosity which is adapted to the method of application and also the polymer has to be chosen in order to be adaptable to the expected working conditions. If the paste produced by the polymer is to be applied by screen-printing the viscosity of the paste should e.g. be between 2-15 Pa s during application of the paste which normally takes place at around a temperature of 20° C. (water: 0.894 cP=0.894·10$^{-3}$ Pa·s).

Piezoelectric Particles

The sintered piezoelectric particles to be used in the composite piezoelectric material can be manufactured from conventional and commercially available piezoelectric ceramic powders including soft and/or hard piezo ceramics, such as lead zirconate titanate (PZT) such as Pz24, Pz26, Pz59 and e.g., lead free piezoceramics. The PzXX powders belonging to the PZT family are sold by Meggitt A/S (Ferroperm Piezoceramics A/S). Also, a lead free piezoelectric ceramic can be used e.g. based on alkali niobate KNN (e.g. $K_{0.5}Na_{0.5}NbO_3$ ferroelectric ceramics).

The piezoelectric ceramic powder is subjected to a high pressure, e.g. above 500 bars, normally above 1500 bars e.g. using a cold isostatic press or by using uniaxial pressing. Before pressing the piezoelectric ceramic powder can be placed in a mould mixed with a pore former, causing blocks of pressured piezoelectric ceramic powder to be formed. The pressed piezoelectric ceramic powder e.g. in the form of blocks is sintered at a temperature above 1000° C. for a time period between ½-2 hours. Normally the temperature will be above 1100° C. and normally the duration of the sintering will be above 1 hr independent of sintering temperature.

After sintering the blocks are crushed and a milled to a desired particle size.

The desired particle size will depend on the thickness of the piezoelectric film or component which is to be produced from the paste.

Piezoelectric Composite Material

The piezoelectric composite material which in its green i.e. not cured form is a paste, contains a polymer matrix mixed with a powder of sintered piezoelectric particles in an amount of 15-75 vol % relative to the matrix, normally between 40-60 vol % relative to the matrix and e.g. additives in a minor amount i.e. less than 10 vol %, normally less than 3 vol % of the total mixture. There is a link between the amount of powder and the final thickness of the layer, but the optimal amount of contained powder also depends on the used polymer.

The additives can e.g. be used to improve the viscosity or the wetting ability of the paste. After having prepared the paste, the paste is either deposited directly on a substrate or on a previously deposited layer of paste in order to increase the thickness of the component.

The composite material has a 0-3 connectivity pattern, which means that the ceramic particles are randomly dispersed in the polymer matrix.

Between the depositing of each layer of the paste and/or after all layers of paste has been deposited on the substrate is finished, the deposited layer(s) is cured and the curing process normally takes place at an increased temperature below 300° C. or between 50-150° C. or alternatively at a temperature between 70-130° C. for a time period of between 5-30 minutes. The curing can also take place at room temperature but then the curing time will be longer. The curing process can also comprise or consist of a treatment of UV-light.

The final thickness of the layered structure i.e. the piezoelectric film is normally between 10-300 μm, or at least above 50 μm, normally between 80 μm to 300 μm.

Generally, a thick film is defined as a layer of material on a substrate having a final thickness above 1 μm, whereas thin films have a final thickness of less than 1 μm. After curing a poling process is carried out at elevated temperature polarising the deposited and cured piezoelectric composite material. For example, the polarisation may be performed by applying a suitable polarisation electrical field to the electrodes, e.g. an electrical field of between 2-10 kV/mm, e.g. between 5-10 kV/mm. The polarisation step may be performed at elevated temperatures, e.g. at temperatures between 80-160° C. In some embodiments the polarisation may be performed by corona poling and standard polarisation by applying an electric field between the electrodes. It has been found that the poling time may be kept below 30 min, e.g. between 10-20 min, when using corona poling, thus allowing for a short manufacturing time and reducing production costs. It might though be difficult to perform corona poling over large areas maintaining the same field distribution, in such a case the standard method would be preferred.

Depositing Method

The piezoelectric material according to the application allows for use of a depositing method such as screen-printing, pad-printing, spraying or other methods where the piezoelectric material due to its flowing properties is transferred to a desired substrate surface. The deposition and curing steps may be repeated so as to build up a layer of increased thickness from individual thinner layers, and/or so as to build up complicated patterns of piezoelectric material.

Screen printing is a through transfer process utilizing a screen as the medium for depositing a film on a substrate. With the aid of a squeegee, the film is transferred through the prepared screen to the substrate using consistent pressures and print speeds, either automatically or manually. When using this method for depositing the paste need not be liquid but need just be plastic and formable.

Pad printing is a printing process that can transfer a 2-D image onto a 3-D object using an indirect offset printing process that involves an image being transferred from a printing plate (cliché) via a silicone pad onto a substrate (surface to be printed). Pad printing has until today been used for printing on otherwise impossible products in many industries including medical, automotive, promotional, apparel, electronics, appliances, sports equipment and toys. It can also be used to deposit functional materials such as conductive inks, adhesives, dyes and lubricants. Physical changes within the transferred film both on the cliché and on the pad allow it to leave the etched image area in favour of adhering to the pad, and to subsequently release from the pad in favour of adhering to the substrate i.e. the material being printed. The properties of the silicone pad enable it to pick the image up from a flat plane and transfer it to a variety of surface i.e. flat, cylindrical, spherical, compound angles, textures, concave surfaces, convex surfaces.

The piezoelectric film might also be deposited by spraying, if this method is used the paste needs to have a relatively low viscosity.

Generally, the film according to the present invention is not produced in bulk form i.e. as sheets or cables which after production is adapted in shape and attached to a surface of the substrate. The thick film is instead created by applying the paste directly to the substrate, it is not necessary to regulate to thickness of the film e.g. by grinding after the film has been made and it is not necessary to fasten the thick film to the substrate surface e.g. by gluing but it might be necessary to pre-treat the surface of the substrate in order to get an acceptable attachment between the added piezoelectric material and the substrate surface. Bonding between the piezoelectric material and the e.g. pre-treated surface normally happens during deposition.

When applying the layer by screen or pad printing it is possible to build up a layer of the material having desired dimensions and pattern. Using other techniques for providing a layer such as e.g. spraying provides less control of creating a layer having a specific thickness and patterning. By screen printing one deposits the material directly on the final substrate/structure therefore the whole processing is simpler and more robust e.g. no need for intermediate bonding is needed.

It is an advantage of embodiments of the process described herein that it does not require any subsequent processing of the deposited layer, such as bonding/gluing lapping or sanding to obtain the desired thickness of the layer.

Substrate

The piezoelectric material according to the application can be used on substrates comprising temperature sensitive materials such as paper, fabrics/textiles or plastics which do not allow use of high temperatures, and/or the piezoelectric material can be used on hard rigid substrates having large or curved surfaces made of e.g. polymers, glass, metal plastics, ceramics, etc. or a combination thereof where it is possible to create a film of the piezoelectric material directly on a surface. In order to optimize the resulting film, it is just necessary to choose an appropriate depositing method.

Piezoelectric Component

A piezoelectric component according to the present application may comprise one or more electrodes, e.g. one or more electrode layers. For example the layer of piezoelectric composite material may be sandwiched between respective electrode layers. Alternatively or additionally, the piezoelectric component may comprise a substrate, an electrode layer disposed on the substrate, and a layer of cured piezoelectric composite material deposited on top of the electrode layer. The electrode layer may be embodied as a patterned structure covering a part of the substrate surface while leaving another part of the substrate surface exposed, and the layer of cured piezoelectric composite material may thus cover the electrode and the exposed part of the substrate surface. For example, the electrode may have the form of a set of interdigitated electrodes.

The piezoelectric component may be used as a piezoelectric sensor, actuator and/or transducer, e.g., as a sensor for detecting stress and/or strains in a material. By the process according to the application it is possible to provide a low profile integrated sensor which is directly deposited on a base structure. Also, the relatively low temperature (<200° C.) applied during curing and poling makes it possible to apply the piezoelectric components to a number of substrates which cannot tolerate higher temperatures.

EXAMPLES

In the following description, reference is made to the accompanying figures, which show by way of illustration how the invention may be practiced.

In order to illustrate the invention, a number of powders which can be used with the darned invention have been prepared. The ceramic powders Pz24, Pz26 and Pz59 are commercially available through MEGGITT A/S. The lead free powder is of the KNN (potassium sodium niobate) family piezoceramic material, which has been developed at MEGGITT A/S and is not commercially available yet.

An amount of approximately 10 g of each powder is subjected to a pressure of above 500 bars for at least one minute, thereby obtaining a pressed part. The pressed parts are then sintered in a furnace at 1100-1300° C. for 1-2 hours. The sintering conditions depend on the powder composition and type of the material.

After sintering the pressed parts are crushed and then ball-milled to a desired particle size of $d_{0.5}$=10-30 µm. Generally, the desired particle size distribution will depend on the deposition technique used for applying the paste, which is prepared on the basis of this powder and of the desired thickness of the prepared films.

Paste Formulation

The concentration of the piezoelectric particles in the mixture depends on the density ratio between the sintered piezoelectric particles and the polymer matrix used, and on a desired composition (vol. % of the powder in the mixture). Therefore, to calculate an amount of polymer matrix in the mixture, the following simple equation can be used:

$$m_{polymer} = m_{powder} \frac{\rho_{polymer}}{\rho_{powder}} \left( \frac{100}{Vol.\ \%} - 1 \right) \quad (1)$$

where $m_{polymer}$, $\rho_{polymer}$ and $m_{powder}$, $\rho_{powder}$ are the weights and densities of the polymer and piezoelectric powder, respectively, and Vol. % is the desired volume percentage of the powder in the mixture.

For all types of the pastes prepared on the basis of Pz24, Pz26, Pz59, and KNN-based powders, a commercially available polymer matrix from DuPont (DP8155) has been used. To improve the fluidity of the paste, a commercially available thinner from DuPont (DP8210) has been added. An alternative polymer material from DuPont (DP3571) has also been tried for use as polymer matrix; however, the results obtained were not as good as those in the case of DP8155 polymer in terms of the piezoelectric performance of the obtained composite material. This was due to the relatively high conductivity of the composite material based on this polymer which made it difficult to pole the composite material and obtain satisfying piezoelectric performance.

The properties of the piezoelectric powders, polymer matrix, and thinner that have been used for preparation are summarized in table 1.

TABLE 1

Properties of piezoelectric particles
and polymer matrix used in examples

| Material: | Relative permittivity (at 25° C., 1 kHz) | Density (g/cm$^3$) |
|---|---|---|
| Pz24 | 400 | 7.70 |
| Pz26 | 1300 | 7.70 |
| Pz59 | 5100 | 7.90 |
| KNN-based | 920 | 4.80 |
| DuPont DP8155 | 8 | 1.13 |

All components (piezoelectric particles/powder, polymer matrix and thinner) are mixed together, and after mixing the ingredients, the mixture was run through a triple-roller mill to ensure a homogenous paste. First, the piezoelectric powder is mixed with the polymer matrix, and then, from 5 to 15 drops of the thinner is added to the mixture, to ensure a good fluidity of the paste. Example of the amounts of the ingredients that have been used for the paste preparation is presented in Table 2.

TABLE 2

Amounts of ingredients used to prepare the
paste of composite piezoelectric material

| | | Weights of the ingredients in the mixture, g | | |
|---|---|---|---|---|
| Vol. % of piezoelectric particles | Type of piezoelectric particles | Piezoelectric particles | Polymer (DuPont DP8155) | Thinner (DuPont DP8120) |
| 40 | Pz24 | 25.0 | 5.5 | 5 drops |
|  | Pz26 | 25.0 | 5.6 | 5 drops |
|  | Pz59 | 25.0 | 5.4 | 5 drops |
| 50 | Pz24 | 25.0 | 3.7 | 8 drops |
|  | Pz26 | 25.0 | 3.8 | 8 drops |
|  | Pz59 | 25.0 | 3.6 | 8 drops |
| 60 | Pz24 | 25.0 | 2.5 | 10 drops |
|  | Pz26 | 25.0 | 2.6 | 10 drops |
|  | Pz59 | 25.0 | 2.4 | 10 drops |
| 38 | KNN-based | 19.5 | 7.5 | 15 drops |

It has been attempted to increase the volume % of PZT power to 70% for the case of Pz24 powder but without any success, due to very low viscosity of the paste making the paste incompatible with the screen- and pad-printing technology.

The polarisation parameters, including the polarisation time, voltage, and temperature have been investigated and optimized for all pastes prepared. A summary of optimal poling conditions and obtained piezoelectric coefficients $d_{33}$ are summarized in table 3.

TABLE 3

Optimized poling parameters for the different composite piezoelectric
materials and obtained piezoelectric coefficients $d_{33}$

| Material | Vol. % of piezoelectric particles | Poling conditions | | | $d_{33}$, pC/N |
|---|---|---|---|---|---|
| | | Temperature, ° C. | Field, kV/mm | Time, min | |
| Pz24 | 40 | 90 | 4.0 | 10 | 29-30 |
| Pz24 | 50 | 90 | 4.0 | 10 | 34-36 |
| Pz24 | 60 | 90 | 3.0 | 10 | 28-29 |
| Pz26 | 40 | 90 | 5.0 | 10 | 26-27 |
| Pz26 | 50 | 90 | 4.0 | 10 | 28-30 |
| Pz26 | 60 | 90 | 3.0 | 10 | 26 |
| Pz59 | 40 | 90 | 4.0 | 10 | 16 |
| Pz59 | 50 | 90 | n/a | n/a | n/a |
| Pz59 | 60 | 90 | n/a | n/a | n/a |
| KNN-based | 38 | 90 | 4.0 | 10 | 20-25 |

For the pastes based on Pz24 and Pz26 materials, both an increasing poling field and an increasing temperature contribute to increase the piezoelectric coefficient of the material up to 30-35 pC/N saturating after about 10 minutes of poling. The poling field has been found to be a parameter which influences the possibility of obtaining a high piezoelectric coefficient, however, it has been difficult to apply higher poling fields in the case of composite piezoelectric materials with higher concentration of piezoelectric particles in the mixture (more than 50 Vol. %), Pastes based on Pz59 material have been found to be difficult to pole, showing relatively low piezoelectric coefficients $d_{33}$.

The poling temperature plays also a role for the successful poling of composite piezoelectric materials, however, it was difficult to increase the poling temperature more than 90-100° C., since the polymer matrix starts to soften at these temperature, complicating the poling procedure and leading to significant increase of the current and consequently to the electrical breakdown.

It has been also observed, that the relative permittivity (e) of the materials increases after the poling of the material and the dielectric loss tangent drops significantly for the most of the samples (see Table 4).

TABLE 4

Characterization results for Pz24 based paste,
printed on Al substrates (measured at 1 kHz)

| | Before poling | | After poling | | $d_{33}$, |
|---|---|---|---|---|---|
| Sample: | ε | tan δ, % | ε | tan δ, % | pC/N |
| 1 | 88.5 | 5.3 | 93.6 | 5.8 | 33.5 |
| 2 | 88.5 | 18.0 | 97.5 | 5.3 | 34.3 |
| 3 | 89.7 | 5.4 | 93.4 | 5.7 | 33.1 |
| 4 | 89.4 | 8.1 | 96.5 | 5.6 | 32.8 |
| 5 | 86.5 | 31.0 | 94.0 | 5.8 | 32.0 |

The dielectric and piezoelectric properties of the pastes also depend on the substrate on which the paste is applied.

The paste on the basis of Pz24 piezoelectric material with 50 Vol. % of the powder in the mixture has been found as an optimal solution in relation to piezoelectric performance of a composite piezoelectric materials on the basis of this paste. The paste on the basis of KNN-based material shows in general lower piezoelectric performance than that for the PZT-based materials, giving however another advantages such as biocompatibility and more simple recycling of the components on the basis of this paste.

Paste Deposition and Post Processing

The piezoelectric paste based on the piezoelectric paste containing 50 vol % Pz24 was deposited on a substrate using a screen-printing technique, where the paste was deposited in 3 layers through a mesh with a desired pattern onto a ceramic or fabric substrate. The printed thick films were heat treated for 10 minutes in an oven at 100° C. between each layer deposition, and after all 3 layers was deposited, the structure was cured at 100° C. for 15 minutes. The final thickness of the deposited layers was in the range of 100-120 µm. After curing and screen printing of electrodes, polarisation of the piezoelectric film was carried out at an elevated temperature of 90° C. in an oven with and applied an external field of 3-5 kV/mm (depending on the type of the paste used).

Figure 2:
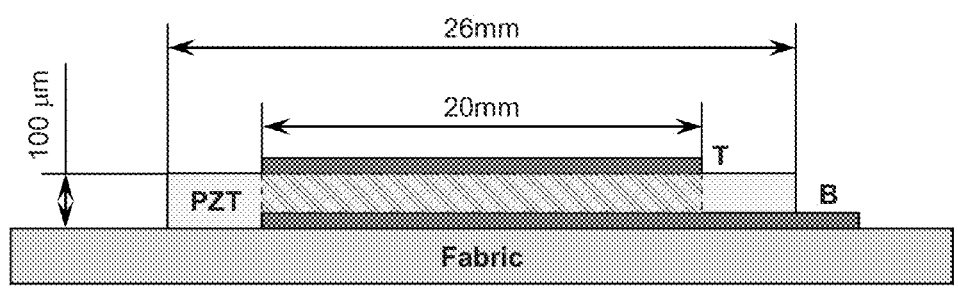
FIG. 2 shows a cross-section of piezoelectric sensor/actuator. B and T correspond to bottom, and top silver screen-printed electrodes, respectively.

FIG. 1 illustrates an example of a piezoelectric sensor component. FIG. 1a shows a top view of the component, while FIG. 1b shows a cross sectional view of the component. The component comprises a substrate 1, top and bottom electrodes 2, and a thick film layer of a composite piezoelectric material 3 as described herein. A schematic cross sectional view of such sensor 1 actuator (e.g. buzzer) is shown in FIG. 2. The structure represents a planar sandwich structure having an active piezoelectric layer in between of bottom and top screen-printed electrodes.

The electrodes are made of a suitable conductive material, such as a metal, e.g. copper, gold, platinum, etc. or alloys thereof. In this particular case (piezoelectric sensor (buzzer)), the electrodes represent silver based electrodes (commercially available silver paste electrodes e.g. DuPont 5000 or DuPont 5028), suitable for screen- or pad-printing technology. The electrode structure is cured at the same conditions as in the case of curing of the paste of composite piezoelectric material—100° C. for 10-15 min.

Figure 3:
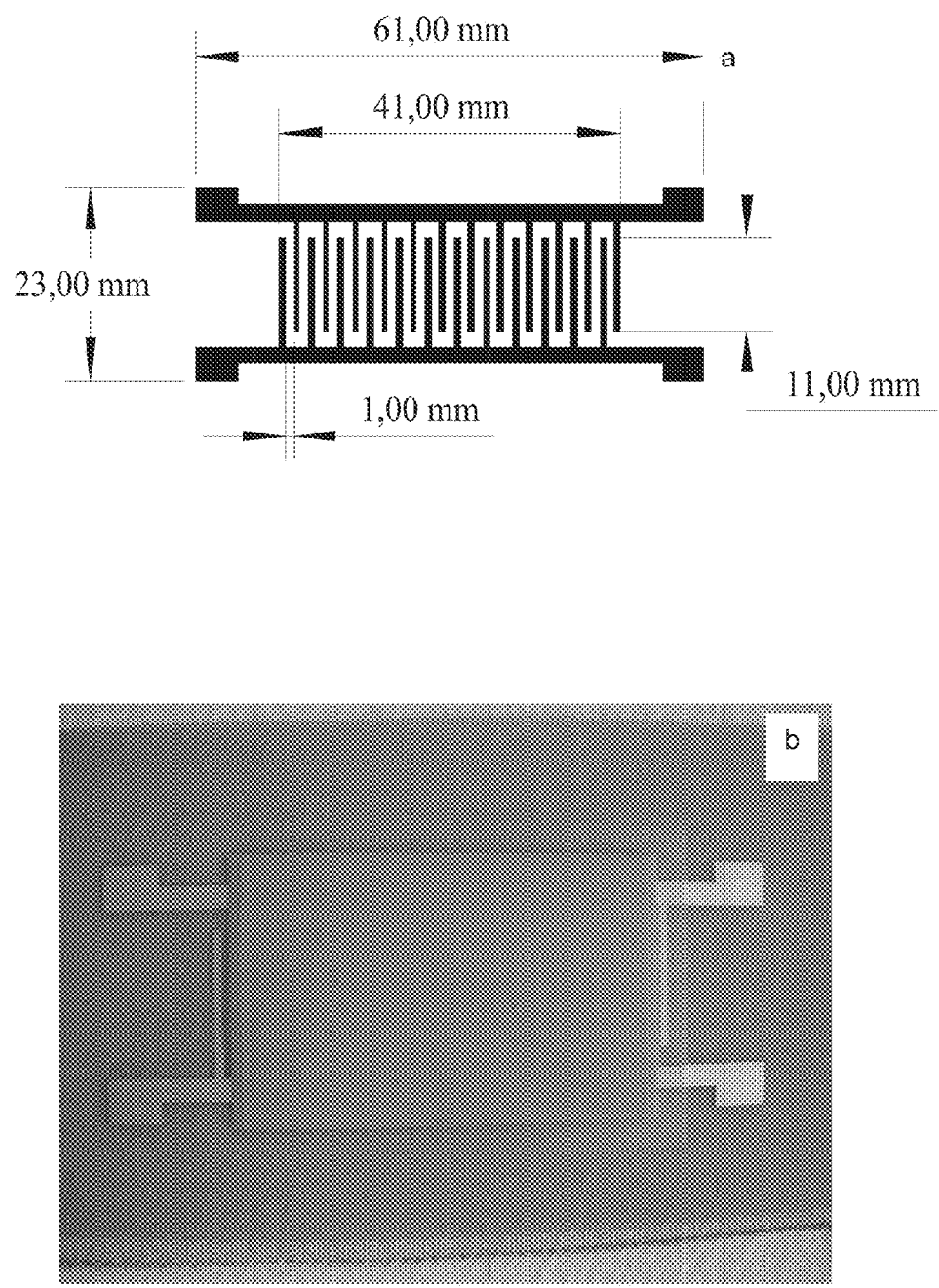
FIG. 3 shows an interdigitated electrodes structure (a) and top view of motion sensor on the basis of composite piezoelectric material printed on textile (b).

FIG. 3 illustrates an example of a piezoelectric sensor component with interdigitated electrodes structure. The electrodes of the sensor in FIG. 3 are in the form of a pair of interdigitated electrodes, each having a comb-like shape. The electrodes are made of the same conductive material suitable for screen- and pad-printing technology as in the case described above (see FIG. 1 and FIG. 2). The electrodes may be deposited by screen printing on the substrate. In some embodiments, the spacing between the interdigitated electrodes may be 100 µm or larger. The piezoelectric composite material may be manufactured and deposited on top of the electrodes as described herein. As can be most clearly seen from FIG. 1 and FIG. 2, the layer of piezoelectric composite material may have a layer thickness larger than the thickness of the electrodes, and in this case. The piezoelectric composite material fills the gaps between the interdigitated electrodes and covers the electrodes, only leaving electrode terminals unexposed.

The components illustrated in FIGS. 2 and 3 can also be used to generate electrical energy from vibrations i.e. for energy harvesting applications.

Figure 4:
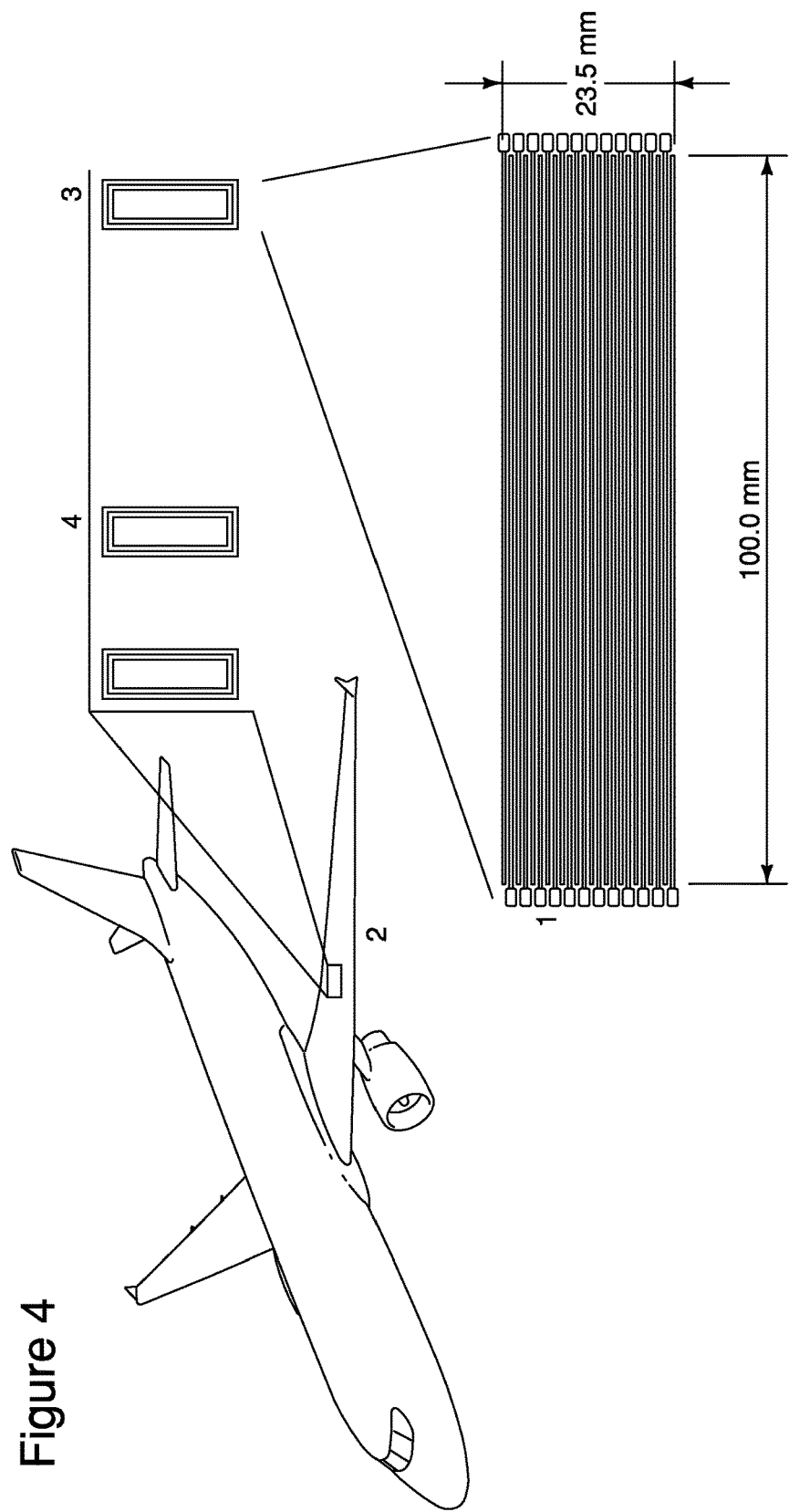
FIG. 4 shows an example of Structural Health Monitoring System (SHM) on aircraft.

FIG. 4 illustrates an example of a transducer, made from the claimed piezoelectric composite material using an interdigitated electrode structure (1) for Structural Health Monitoring (SHM) of an aircraft. SHM is a collective term for advanced technologies using sensor networks for monitoring the structural integrity of structures of high importance. In this case, each transducer is a linear array, i.e. consisting of a row of elements. Acoustic waves such as Lamb waves can be generated in the structure of interest, e.g., the fuselage of an aircraft wing (2), by sending electrical signals to one of the transducer arrays (3). By analysing the acoustic waves received by another transducer array (4), it is possible to detect structural defects such as cracks.

The invention claimed is:

1. A method of manufacturing a piezoelectric paste and curing the paste into a piezoelectric element comprising:
    pressing a ceramic piezoelectric active powder with a relative permittivity of about 400 into a solid unit;
    sintering the solid unit;
    crushing and milling the solid unit into piezoelectric particles;
    mixing the piezoelectric particles with a binding matrix that has a permittivity of about 8 to form the piezoelectric paste, wherein the piezoelectric powder comprises between 40% and 50% by volume of the piezoelectric paste;
    mixing the piezoelectric particles and binding matrix with a thinner until the viscosity of the piezoelectric paste is between 2 and 15 PaS;
    applying a layer of the piezoelectric paste with a thickness between 10 and 300 micrometers to a substrate;
    curing the layer of piezoelectric paste wherein a median diameter of the piezoelectric particles in the layer of piezoelectric paste is $1/10$ or less a cured thickness of the layer of piezoelectric paste; and
    poling the cured piezoelectric paste at an elevated temperature of 90° Celsius for 10 minutes.

2. The method of claim 1, wherein the minimum thickness of the layer is comprised of a plurality of separately deposited thinner layers.

3. The method of claim 1, wherein the piezoelectric particles comprise 50% of the volume of the piezoelectric paste.

4. The method of claim 1, wherein the binding matrix is a polymer material.

5. The method of claim 1, wherein the binding matrix is a fluoride based polymer.

6. The method of claim 1, wherein the binding matrix is Polyvinylidene fluoride.

7. The method of claim 1, wherein the applying step is performed using screen-printing or pad-printing.

8. The method of claim 1, wherein the binding matrix is 8155 made by DuPont.

9. The method of claim 1, wherein the thinner is 8210 made by DuPont.

10. A method of manufacturing a piezoelectric paste and curing the paste into a piezoelectric element comprising:
    pressing a ceramic piezoelectric active powder with a permittivity between 400 and 1000 into a solid unit;
    sintering the solid unit;
    crushing and milling the solid unit into piezoelectric particles;
    mixing the piezoelectric particles with a binding matrix with a permittivity greater than or equal to 6 to form the piezoelectric paste, wherein the piezoelectric particles comprise between 40% and 60% by volume of the piezoelectric paste;
    mixing the piezoelectric particles and binding matrix with a thinner until the viscosity of the piezoelectric paste is between 2 and 15 PaS;
    applying a layer of the piezoelectric paste with thickness between 10 and 300 micrometers to a substrate;
    curing the layer of piezoelectric paste wherein a median diameter of the piezoelectric particles is $1/10$ or less a cured thickness of the layer of piezoelectric paste; and
    poling the cured piezoelectric paste at an elevated temperature of 90° Celsius for 10 minutes.

11. The method of claim 10, wherein the piezoelectric particles comprise about 50% by volume of the piezoelectric paste.

12. The method of claim 1, wherein the viscosity of the piezoelectric paste is measured at a shear rate equal to 33.3 (1/sec).

13. The method of claim 10, wherein the viscosity of the piezoelectric paste is measured at a shear rate equal to 33.3 (1/sec).

14. The method of claim 10, wherein the binding matrix is a polymer material.

15. The method of claim 10, wherein the binding matrix is a fluoride based polymer.

16. The method of claim 10, wherein the binding matrix is Polyvinylidene fluoride.

17. The method of claim 10, wherein the applying step is performed using screen-printing or pad-printing.

18. The method of claim 10, wherein the ceramic piezoelectric active powder is Lead-Free.

* * * * *